(12) United States Patent
Silveira et al.

(10) Patent No.: US 10,537,013 B2
(45) Date of Patent: Jan. 14, 2020

(54) DISTRIBUTED ELECTRO-STATIC CHUCK COOLING

(71) Applicant: APPLIED MATERIALS, INC., Santa Clara, CA (US)

(72) Inventors: Fernando Silveira, Livermore, CA (US); Richard Fovell, San Jose, CA (US); Hamid Tavassoli, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1217 days.

(21) Appl. No.: 13/863,226

(22) Filed: Apr. 15, 2013

(65) Prior Publication Data
US 2013/0276981 A1 Oct. 24, 2013

Related U.S. Application Data

(60) Provisional application No. 61/637,213, filed on Apr. 23, 2012, provisional application No. 61/692,190, filed on Aug. 22, 2012.

(51) Int. Cl.
*H05H 1/00* (2006.01)

(52) U.S. Cl.
CPC .................................... *H05H 1/00* (2013.01)

(58) Field of Classification Search
None
See application file for complete search history.

(56) References Cited

U.S. PATENT DOCUMENTS

| 4,275,289 A * | 6/1981 | Lord | H01L 21/67109 |
| | | | 165/156 |
| 4,565,601 A * | 1/1986 | Kakehi | C23C 14/541 |
| | | | 156/345.27 |
| 5,382,311 A * | 1/1995 | Ishikawa | C23C 16/4586 |
| | | | 118/723 E |

(Continued)

FOREIGN PATENT DOCUMENTS

| JP | 2008028354 | 2/2008 |
| JP | 2011091297 | 5/2011 |
| KR | 10-2008-0076432 | 8/2008 |

OTHER PUBLICATIONS

Final Office Action from U.S. Appl. No. 13/860,479 dated Nov. 30, 2015, 21 pgs.

(Continued)

*Primary Examiner* — Kambiz Zand
*Assistant Examiner* — Mirza Israr Javed
(74) *Attorney, Agent, or Firm* — Schwabe, Williamson & Wyatt, P.C.

(57) ABSTRACT

Embodiments of the invention include an apparatus, system, and method for cooling a pedestal for supporting a workpiece during plasma processing. An embodiment of a pedestal includes: a base over which the workpiece is to be disposed, a plurality of nozzles to supply a fluid from a supply plenum to impinge on a surface of the base, and a plurality of return conduits to return the supplied fluid to a return plenum. The fluid to be supplied by the plurality of nozzles can be projected as one or more jets submerged in surrounding fluid or as a spray that emerges from a surrounding fluid within a volume between the plurality of nozzles and the base to impinge on the surface of the base.

18 Claims, 15 Drawing Sheets

Distribution Plate

(56) References Cited

U.S. PATENT DOCUMENTS

| | | | | |
|---|---|---|---|---|
| 5,547,539 | A | * | 8/1996 | Arasawa ............ C23C 16/4586 156/345.26 |
| 5,569,361 | A | * | 10/1996 | Hurwitt ............... C23C 14/3407 204/192.12 |
| 5,748,435 | A | * | 5/1998 | Parkhe .................... G03F 7/707 361/234 |
| 6,320,736 | B1 | * | 11/2001 | Shamouilian ....... C23C 16/4586 361/115 |
| 6,359,264 | B1 | * | 3/2002 | Schaper ............ H01L 21/67126 118/724 |
| 6,635,853 | B2 | * | 10/2003 | Saito .................... B60N 2/3011 219/444.1 |
| 6,740,853 | B1 | | 5/2004 | Johnson et al. |
| 2007/0148364 | A1 | | 6/2007 | Iijima et al. |
| 2008/0089001 | A1 | | 4/2008 | Parkhe et al. |
| 2009/0159566 | A1 | * | 6/2009 | Brillhart ............. C23C 16/4586 216/58 |
| 2009/0201622 | A1 | | 8/2009 | Brown et al. |
| 2010/0003829 | A1 | | 1/2010 | Patrick et al. |
| 2011/0024047 | A1 | * | 2/2011 | Nguyen ................ C23C 14/564 156/345.51 |
| 2012/0016508 | A1 | * | 1/2012 | Matsuzaki ........ H01J 37/32449 700/108 |
| 2013/0276980 | A1 | | 10/2013 | Lubomirsky et al. |

OTHER PUBLICATIONS

Non-Final Office Action from U.S. Appl. No. 13/860,479 dated May 5, 2015, 17 pgs.
International Preliminary Report on Patentability from PCT/US2013/036985 dated 7, Nov. 6, 2014 pgs.
International Preliminary Report on Patentability for International Patent Application No. PCT/US2013/036985, dated Nov. 6, 2014, 6 pages.
Non-Final Office Action for U.S. Appl. No. 13/860,479 dated Oct. 23, 2014, 18 pages.
International Search Report and Written Opinion for International Patent Application No. PCT/US2013/036985, dated Jul. 4, 2013, 9 pages.
International Search Report and Written Opinion from PCT/US2013/036985 dated Jun. 28, 2013, 7 pages.

* cited by examiner

Top Distribution Plate

Distribution Plate Bottom

DISTRIBUTED ELECTRO-STATIC CHUCK COOLING

CROSS REFERENCE TO RELATED APPLICATIONS

This application claims the benefit of U.S. Provisional Application 61/637,213 filed on Apr. 23, 2012 titled "DISTRIBUTED ELECTRO-STATIC CHUCK COOLING" and U.S. Provisional Application No. 61/692,190 filed on Aug. 22, 2012, titled "DISTRIBUTED ELECTRO-STATIC CHUCK COOLING," the entire contents of which are hereby incorporated by reference in their entirety for all purposes.

TECHNICAL FIELD

Embodiments of the present invention relate to the microelectronics manufacturing industry and more particularly to temperature-controlled pedestals for supporting a workpiece during plasma processing.

BACKGROUND

Power density in plasma processing equipment, such as equipment designed to perform plasma etching of microelectronic devices and the like, is increasing with the advancement in fabrication techniques. For example, powers of 5 to 10 kilowatts are now in use for 300 mm substrates. With the increased power densities, enhanced cooling of a pedestal supporting a workpiece is beneficial during processing to control the temperature of the workpiece uniformly. Existing methods of cooling during plasma processing can only achieve a certain level of cooling of a workpiece, which may be insufficient for some processing environments. One such method is to circulate fluid through a channel at the bottom of an electrostatic chuck so that the fluid flows through the channel and thus travels parallelly to the chuck's surface. Thermal non-uniformities occurring on a workpiece due to insufficient cooling during processing cannot be sufficiently compensated for with other hardware and process tuning, and can affect on-wafer performance.

BRIEF DESCRIPTION OF THE DRAWINGS

Embodiments of the present invention are illustrated by way of example, and not limitation, in the figures of the accompanying drawings in which:

FIG. 2i illustrates a plan view of a top surface of the lower cover of FIG. 2h, in accordance with an embodiment;

DETAILED DESCRIPTION

Figure 1:
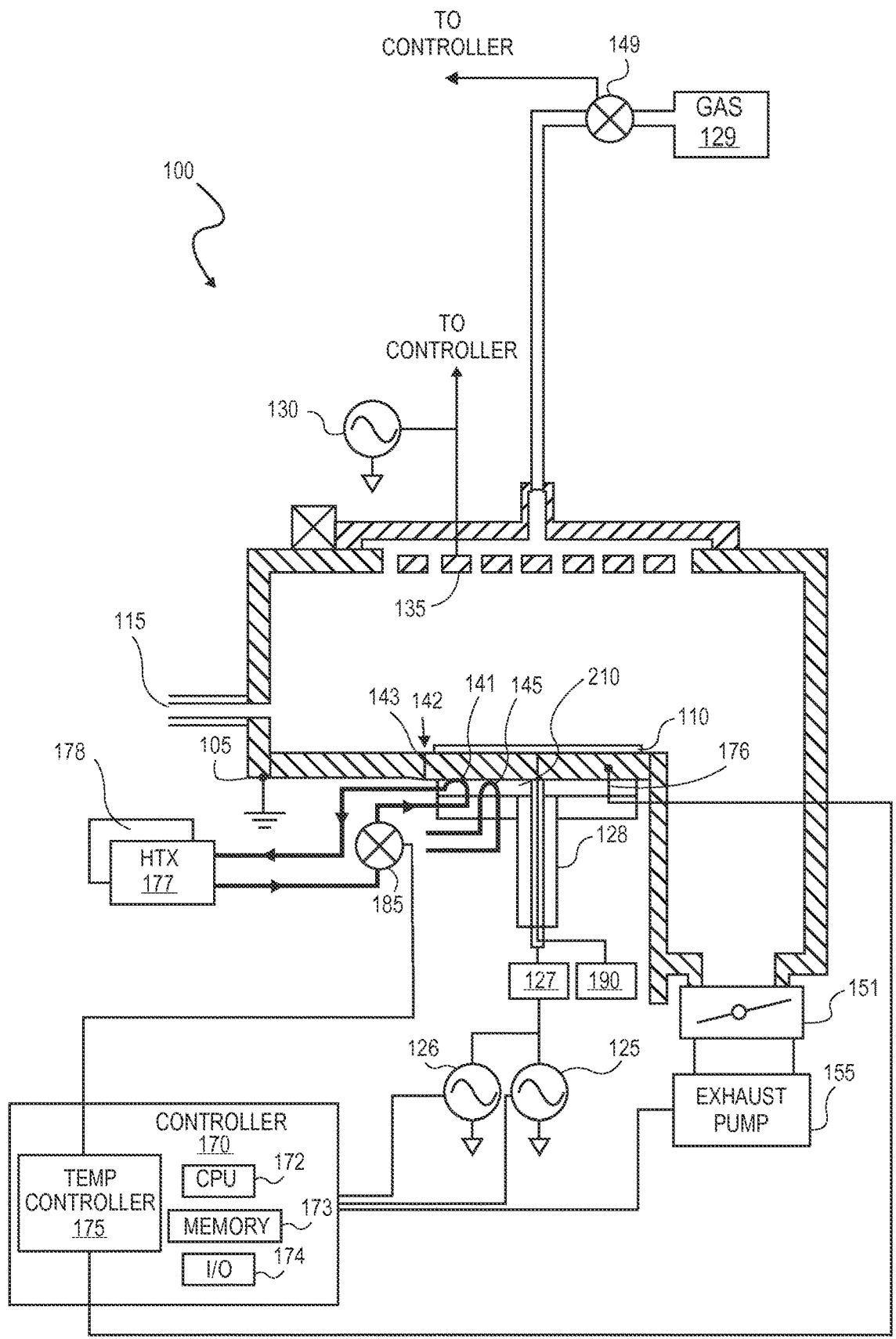
FIG. 1 is a schematic of a plasma etch system including a pedestal to support a workpiece during plasma processing in accordance with an embodiment of the present invention.

The following description describes embodiments of an apparatus, system, and method for cooling a pedestal to support a workpiece during plasma processing. A workpiece can be any workpiece employed in plasma processing. For example, a workpiece can be a semiconductor wafer. A pedestal can include any assembly for supporting a workpiece. For example, a pedestal can support a chuck which holds a workpiece. Supporting a workpiece can include fully or partially supporting the workpiece in conjunction with other means of support, and can include direct or indirect support. For example, a pedestal can support a workpiece in conjunction with an electrostatic clamping means.

In one embodiment, a pedestal includes a cooling base assembly to achieve uniform cooling across a surface of the pedestal, and therefore cooling of a workpiece disposed on the pedestal. According to one embodiment, a cooling base assembly produces a plurality of jets or a spray of a cooling fluid to impinge nonparallelly on a surface of the cooling base.

In one embodiment, the cooling base assembly as described herein enables uniform cooling of the pedestal via spray and/or jet cooling in a plasma-processing context. According to one embodiment, the cooling base assembly utilizing spray and/or jet cooling enables substantial heat transfer due to a synergy of features as described herein, including one or more of: placement of plates and components, the diameter of nozzles for producing the jets and/or spray, the depth of the nozzles (i.e., the distance of the top surface of the nozzles away from the surface of the cooling base), and/or the pattern of jets and/or spray. Such cooling base assemblies can enable heat removal for processing conditions producing substantial heat (e.g., rates of heat transfer of 10,000 watts or more).

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics described herein may be combined in any suitable manner in one or more embodiments. For example, features described in the context of a first embodiment may be combined with features described in a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship). The terms "fluidly coupled" and "fluid communication" refer to structural relationships of elements which allow the passage of a fluid from one of the elements to another. Therefore, first and second elements that are "fluidly coupled" are coupled together in a manner which places the first element in fluid communication with the second element such that fluid in the first element is transferable to the second element, and vice versa, depending on the direction of pressure drop between the elements.

FIG. 1 is a schematic of a plasma etch system 100 including a pedestal assembly 142 in accordance with an embodiment of the present invention. The plasma etch system 100 may be any type of high performance etch chamber known in the art, such as, but not limited to, Enabler™, MxP®, MxP+™, Super-E™, DPS II Advant-Edge™ G3, or E-MAX® chambers manufactured by Applied Materials of CA, USA. Other commercially available etch chambers may similarly utilize the pedestal assemblies described herein. While the exemplary embodiments are described in the context of the plasma etch system 100, the pedestal assembly described herein is also adaptable to other processing systems used to perform any plasma fabrication process (e.g., plasma deposition systems, etc.) that places a heat load on a workpiece supported by the pedestal.

Referring to FIG. 1, the plasma etch system 100 includes a vacuum chamber 105, that is typically grounded. A workpiece 110 is loaded through an opening 115 and clamped to a pedestal assembly 142. The workpiece 110 may be any conventionally employed in the plasma processing art (e.g., semiconductor wafer or other workpiece employed in plasma processing) and the present invention is not limited in this respect. The workpiece 110 is disposed on a top surface of a dielectric material 143 disposed over a cooling base assembly 210. Process (source) gases are supplied from gas source(s) 129 through a mass flow controller 149 to the interior of the chamber 105 (e.g., via a gas showerhead). Chamber 105 is evacuated via an exhaust valve 151 connected to a high capacity vacuum pump stack 155.

When plasma power is applied to the chamber 105, a plasma is formed in a processing region over workpiece 110. A plasma bias power 125 is coupled into the pedestal assembly 142 to energize the plasma. The plasma bias power 125 typically has a low frequency between about 2 MHz to 60 MHz, and may be for example in the 13.56 MHz band. In the exemplary embodiment, the plasma etch system 100 includes a second plasma bias power 126 operating at about the 2 MHz band which is connected to the same RF match 127 as plasma bias power 125 and coupled to a lower electrode via a power conduit 128. A plasma source power 130 is coupled through a match (not depicted) to a plasma generating element 135 to provide high frequency source power to inductively or capacitively energize the plasma. The plasma source power 130 may have a higher frequency than the plasma bias power 125, such as between 100 and 180 MHz, and may for example be in the 162 MHz band.

The temperature controller 175 is to execute temperature control algorithms and may be either software or hardware or a combination of both software and hardware. The temperature controller 175 may further comprise a component or module of the system controller 170 responsible for management of the system 100 through a central processing unit (CPU) 172, memory 173, and input/output (I/O) interfaces 174. The temperature controller 175 is to output control signals affecting the rate of heat transfer between the pedestal assembly 142 and a heat source and/or heat sink external to the plasma chamber 105. In the exemplary embodiment, the temperature controller 175 is coupled to a first heat exchanger (HTX) or chiller 177 and a second heat exchanger or chiller 178 such that the temperature controller 175 may acquire the temperature setpoint of the HTX/chillers 177, 178 and temperature 176 of the pedestal assembly, and control a heat transfer fluid flow rate through fluid conduits 141 and/or 145 in the pedestal assembly 142. One or more valves 185 (or other flow control devices) between the heat exchanger/chiller and fluid conduits in the pedestal assembly may be controlled by temperature controller 175 to independently control a rate of flow of the heat transfer fluid to the plurality of fluid conduits 141, 145. In the exemplary embodiment therefore, two heat transfer fluid loops are employed. Other embodiments may include one or more heat transfer loops. Any heat transfer fluid known in the art may be used. The heat transfer fluid may comprise any fluid suitable to provide adequate transfer of heat to or from the substrate. For example, the heat transfer fluid may be a gas, such as helium (He), oxygen ($O_2$), or the like. However, in the exemplary embodiment the heat transfer fluid is a liquid, such as, but not limited to, Galden®, Fluorinert®, or ethylene glycol/water.

Figure 2A:
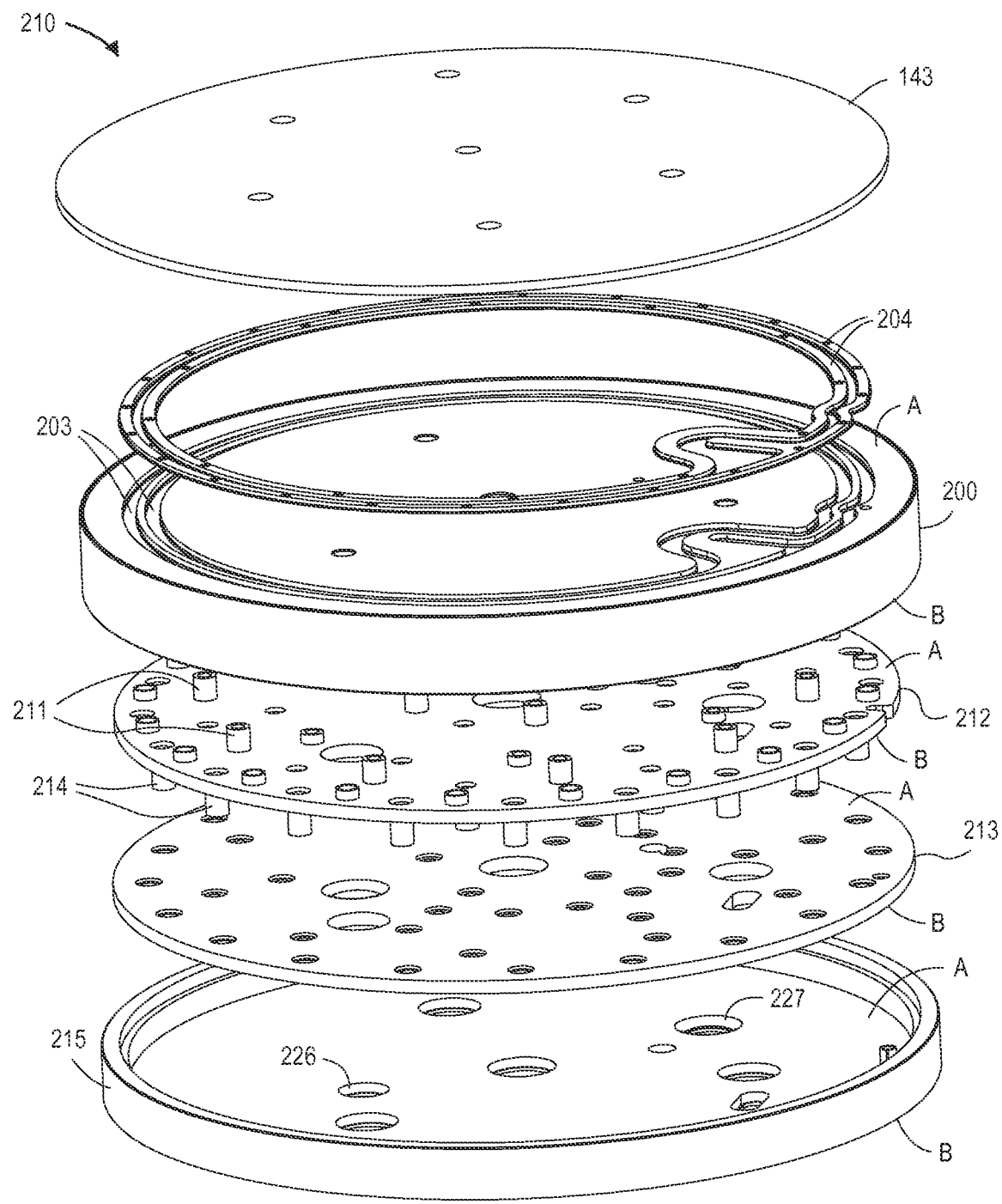
FIG. 2a illustrates an exploded isometric view of a cooling base assembly that is employed in the pedestal of FIG. 1, in accordance with an embodiment.

FIG. 2a illustrates an exploded isometric view of an assembly comprising the cooling base assembly 210 employed in the pedestal assembly 142, in accordance with an embodiment.

According to the illustrated embodiment, a workpiece is disposed on a top surface of a dielectric material 143 disposed over a cooling base assembly 210. The dielectric material 143 may be any known in the art. For example, in one embodiment, the dielectric material 143 is a ceramic (e.g., AN) capable of maintaining an electrostatic charge near the top surface to electrostatically clamp the workpiece during processing. Generally, the dielectric material 143 may be operable as any electrostatic chuck (ESC) known in the art, such as, but not limited to a Johnson-Raybeck (JR) chuck. In one exemplary embodiment, the dielectric material 143 comprises a ceramic puck having at least one electrode (e.g., a mesh or grid) embedded in the ceramic to induce an electrostatic potential between a surface of the ceramic and a workpiece disposed on the surface of the ceramic when the electrode is electrified.

As shown in FIG. 2a, cooling base assembly 210 includes a base 200, a distribution plate 212, a plenum plate 213, and a lower cover 215. Each of the base 200, distribution plate 212, plenum plate 213, and lower cover 215 has a top surface A and a bottom surface B. The base 200 has a top surface that is substantially smooth except for the helium distribution grooves 203 into which the helium supply rings 204 are seated. The helium supply rings 204 can be used to supply helium via the chuck to the surface of the workpiece to create pressure for thermal conduction with the workpiece. The base 200 further includes through holes which can accommodate various lift pins, sensor probes (e.g., fiber optic temperature probes, IV probes, etc.), as well as DC electrode and/or resistive heater power supply lines. The base 200 is to function as a thermally conductive mechanical fluid barrier between the dielectric material 143 and the distribution plate 212. The base 200 has a bottom surface which may be exposed to a heat transfer fluid. As heat transfer fluid is contained by the base 200 with no fluid passing to the top surface of the base 200, the base may be considered an upper cap of the cooling base assembly 210. The lower cover 215 may be considered a lower cap of the cooling assembly. As illustrated, the lower cover 215 comprises a supply opening 226 through which the fluid is supplied, and a return opening 227 through which the fluid is returned.

In the exemplary embodiment, the distribution plate 212 and the base 200 is each a separate plate of a material, preferably the same material (e.g., aluminum) for the sake of matching coefficients of thermal expansion (CTE). The cooling base assembly 210 may be fabricated in multiple steps, with main parts/components that are joined by one or more processes including permanently bonding, welding, bracing, press fitting, or removably attaching by screws, etc. during fabrication to make one complete cooling base assembly. In one embodiment, parts used for forming vacuums can be heat welded to prevent vacuum leaks. In one embodiment, resistive heaters can be embedded in at least one of the dielectric material 143, the base 200, the distribution plate 212, the plenum plate 213, or the lower cover 215.

The cooling base assembly 210 includes a plurality of nozzles 211 to supply a fluid from a supply plenum to impinge nonparallelly on a surface of the base 200. In an exemplary embodiment, the plurality of nozzles 211 supply a fluid substantially perpendicular to the bottom surface of the base 200. The plurality of nozzles 211 is provided by the distribution plate 212, which is disposed between the plenum plate 213 and the base 200. The heat transfer fluid to be supplied by the plurality of nozzles 211 is of a controlled temperature (e.g., supplied from one or more of the HTX/chillers 177, 178). In one such embodiment, a distribution of heat transfer fluid as described herein maintains the base 200 at a temperature that is highly uniform across the area of the base 200. In particular, embodiments as described herein provide more uniformity than a fluid flow that is parallel to the bottom surface of the base. Maintaining a highly uniform temperature across the area of the base 200 enables maintaining a uniform temperature across the area of the dielectric material 143, and in turn the workpiece as it undergoes processing.

In one embodiment, the fluid to be supplied by the plurality of nozzles 211 is to be projected as one or more jets submerged in surrounding fluid in a volume between the plurality of nozzles 211 and the base 200. For example, the region between the distribution plate 212 and the base 200 can contain fluid, and the plurality of nozzles 211 can project additional fluid as jets through the fluid in the region. In another embodiment, the fluid to be supplied by the plurality of nozzles 211 is to be projected as a spray to emerge from any surrounding fluid in the volume between the plurality of nozzles 211 and the base 200 to impinge nonparallelly on the surface of the base 200. For example, the region between the distribution plate 212 and the base 200 can contain no or little fluid, and the plurality of nozzles 211 can project fluid as a spray to impinge nonparallelly onto the surface of the base 200.

According to one embodiment, use of a spray or jets to impinge on the base 200 results in a high rate of cooling. Impingement of a spray or jets onto the base 200 results in a higher heat transfer coefficient in the area being struck by the spray or jets. For example, in one embodiment in which a spray or jets impinge nonparallelly on the surface of the base 200, the heat transfer coefficient is double the heat transfer coefficient of a channel cooling design where fluid flow is parallel to channel walls; designs where fluid flow is parallel to the channel walls can result in a boundary layer within the fluid, which is detrimental to heat transfer. The pattern, number, width, and/or positioning of the sprays or jets can be adjusted to achieve a lower or higher rate of cooling, and can be adjusted to achieve uniform cooling on the surface of the base 200. In one embodiment, the cooling base assembly 210 includes 5-200 nozzles depending on the desired rate of cooling. In one such embodiment, the cooling base assembly 210 includes less than 100 nozzles. Other numbers of nozzles can also achieve uniform cooling.

According to one embodiment, top surfaces of the plurality of nozzles 211 are spaced a distance away from the surface of base 200 for good cooling and fluid return. For example, a gap can exist between a top surface of each of plurality of nozzles 211 and the base 200, with standoffs coupling the base 200 and the distribution plate 212. In one embodiment, at least one of the plurality of nozzles is spaced a distance away from the surface of the base, while others are not. In yet another embodiment, portions of top surfaces of the plurality of nozzles 211 and the base 200 are in contact with a relief (e.g., notch or vent) formed in a side wall of the nozzle. Adjusting the distance of the plurality of nozzles 211 from the base 200 can result in varying rates of cooling. In one embodiment, the gap between each of the plurality of nozzles 211 and the base 200 is a multiple of the inner diameter of each of the nozzles (e.g., approximately one, two, or three times the diameter of each of the plurality of nozzles 211).

According to one embodiment, each of the plurality of nozzles 211 is sufficiently large so that the plurality of nozzles 211 delivers a large volume of coolant via a spray or jets for a fluid of a particular viscosity. For example, the plurality of nozzles have inner diameters sized to project a spray or jet of a desired conductance to achieve a rate of cooling. In one embodiment, the plurality of nozzles has a plurality of different inner diameters. In another embodiment, each of the plurality of nozzles has a same inner diameter. For example, each of the plurality of nozzles may have an inner diameter of 0.1-0.2 inches. In another embodiment, the inner diameter of each nozzle can be larger or smaller than 0.1-0.2 of an inch to project spray or jets of a desired conductance to achieve other rates of cooling. In embodiments of the invention employing a liquid such as Galden®, the plurality of nozzles 211 are capable of delivering 6 gallons of fluid per minute, 8 gallons per minute, or more.

In embodiments, a cooling base assembly also includes a plurality of return conduits to return the supplied fluid to a return plenum. In the embodiment of FIG. 2a, return conduits 214 are in the distribution plate 212. The return conduits 214 pass fluid through to a bottom side of the plenum plate 213. In one embodiment, the arrangement and dimensions of the plurality of nozzles 211, the plurality of return conduits 214, and the plenums enables a high rate of cooling while enabling evacuation of the cooling fluid without an excessive pressure drop. For example, cooling base assembly 210 may have a pressure drop of 10-20 PSI across its low and high pressure plenums.

In one embodiment, the total conductance of the plurality of return conduits 214 is greater than the total conductance of the plurality of nozzles 211 so that the cooling base assembly 210 is capable of removing fluid at a faster rate than supplying fluid to ensure good flow by the spray or jet. For example, a greater total conductance of the return conduits 214 can be achieved by making the diameter of each of plurality of return conduits 214 greater than the diameter of each of the plurality of nozzles 211, by providing a greater number of return conduits than supply nozzles, or by a combination thereof.

Figure 2B:
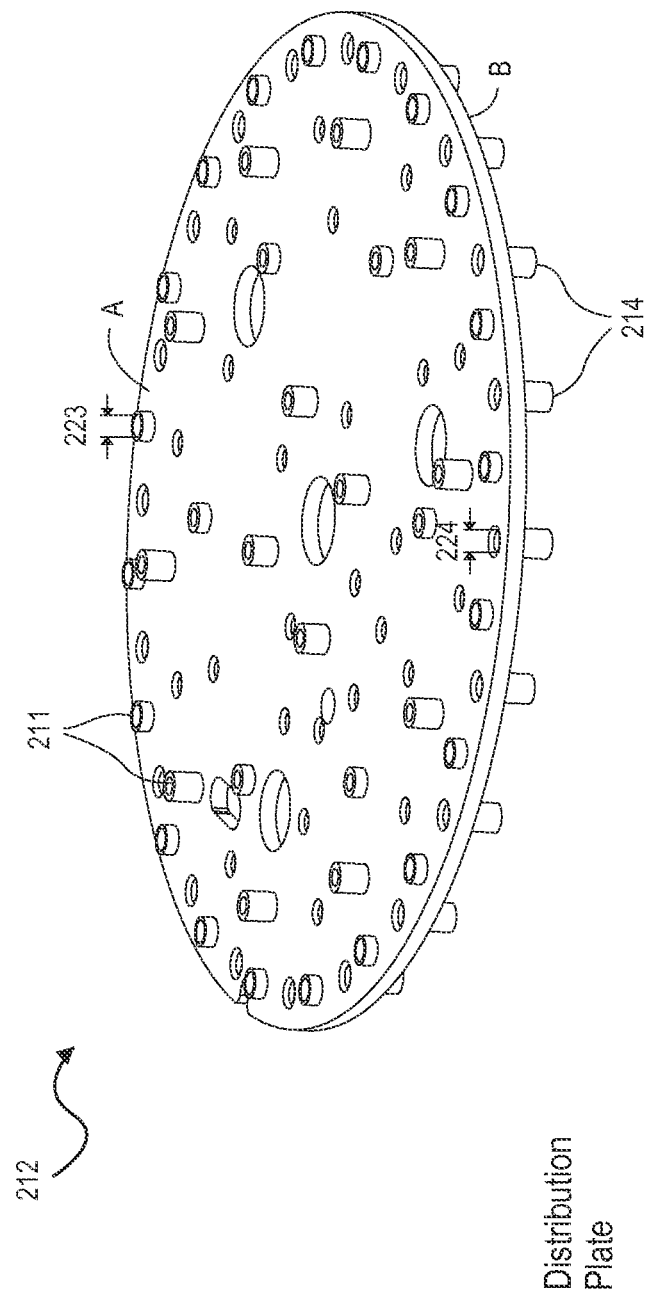
FIG. 2b illustrates an isometric view of a distribution plate that is employed in the cooling base assembly of FIG. 2a, in accordance with an embodiment.
Figure 2C:
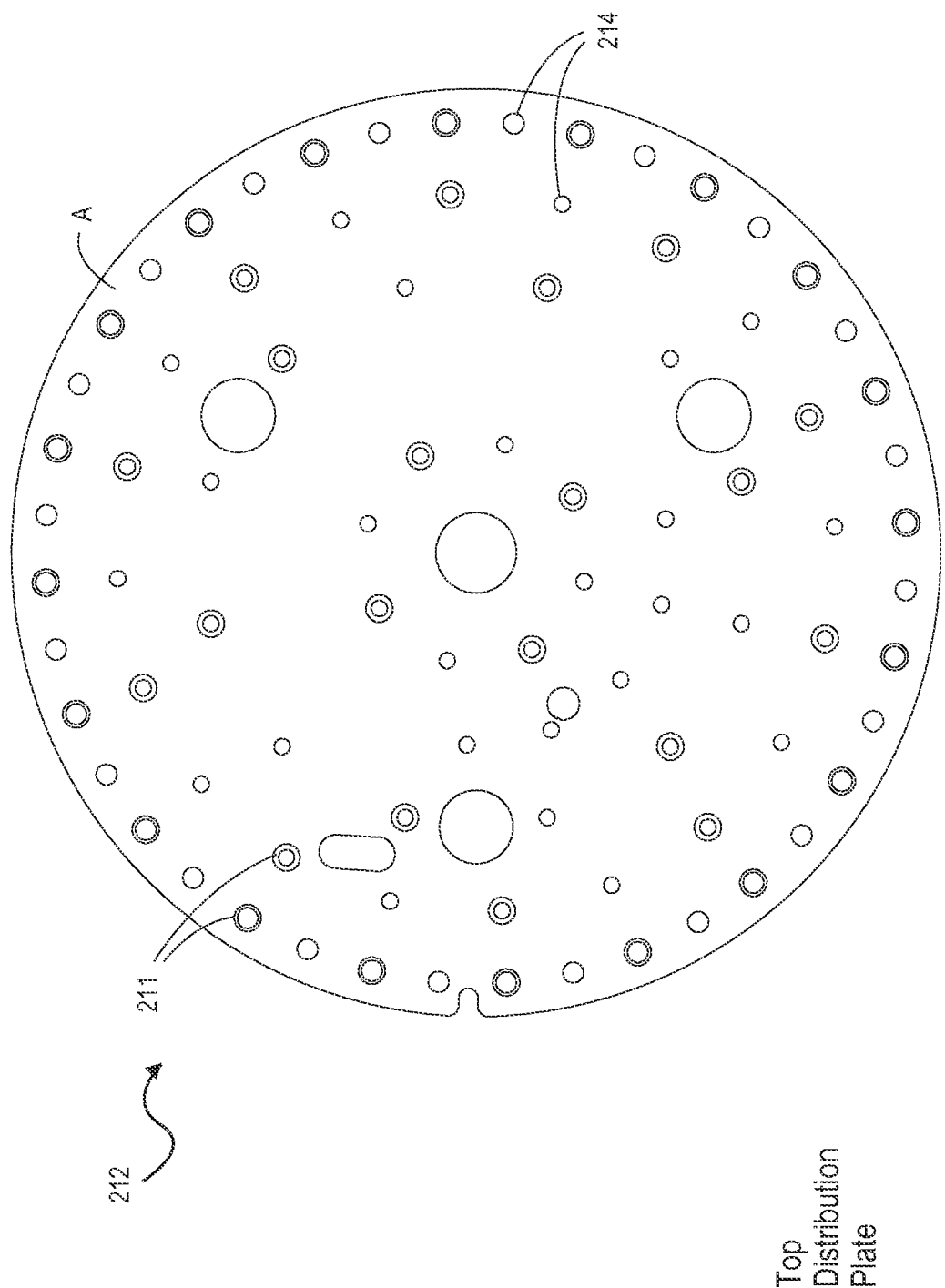
FIG. 2c illustrates a plan view of a top surface of the distribution plate of FIG. 2b, in accordance with an embodiment.
Figure 2D:
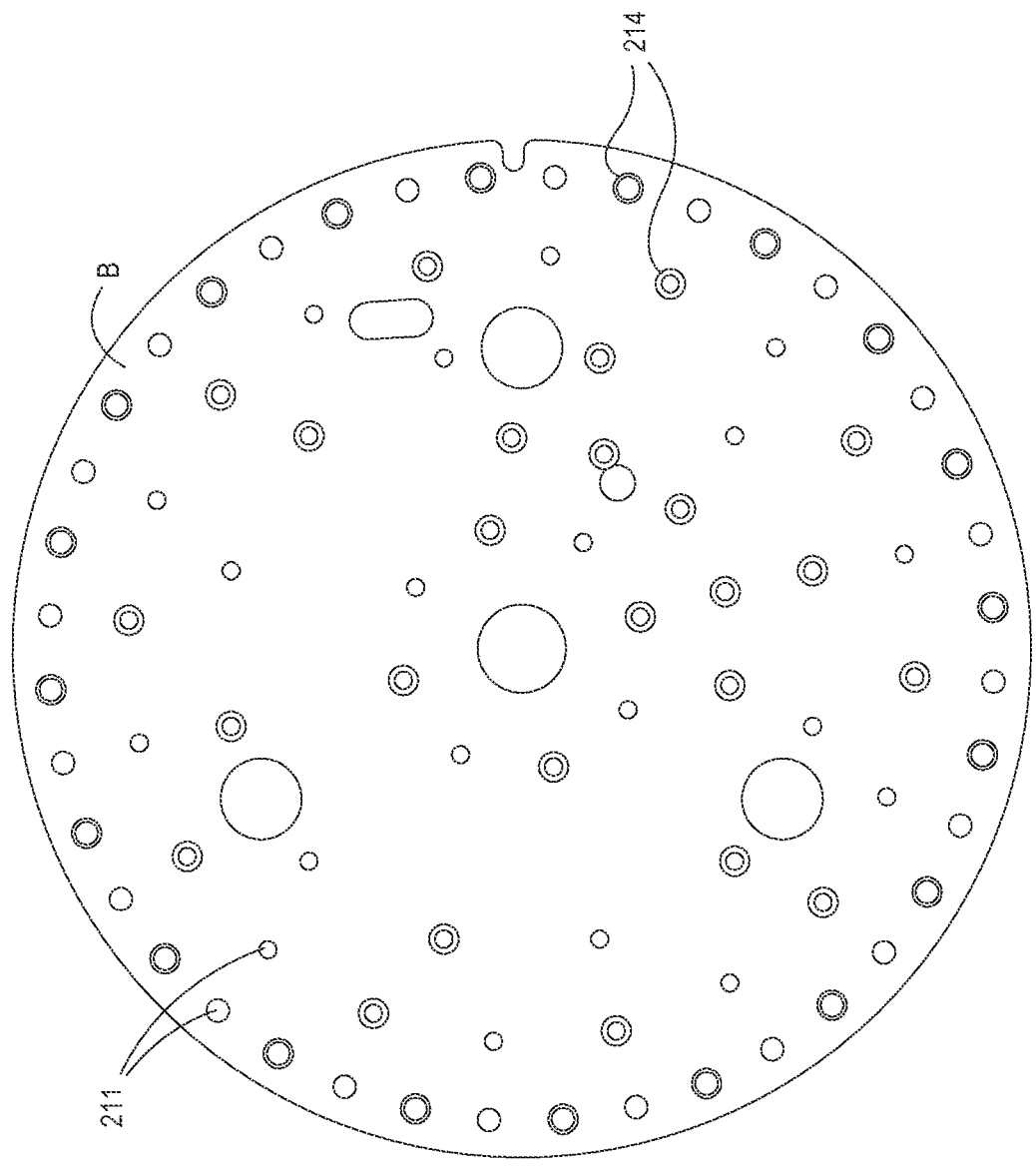
FIG. 2d illustrates a plan view of a bottom surface of the distribution plate of FIG. 2b, in accordance with an embodiment.
Figure 2E:
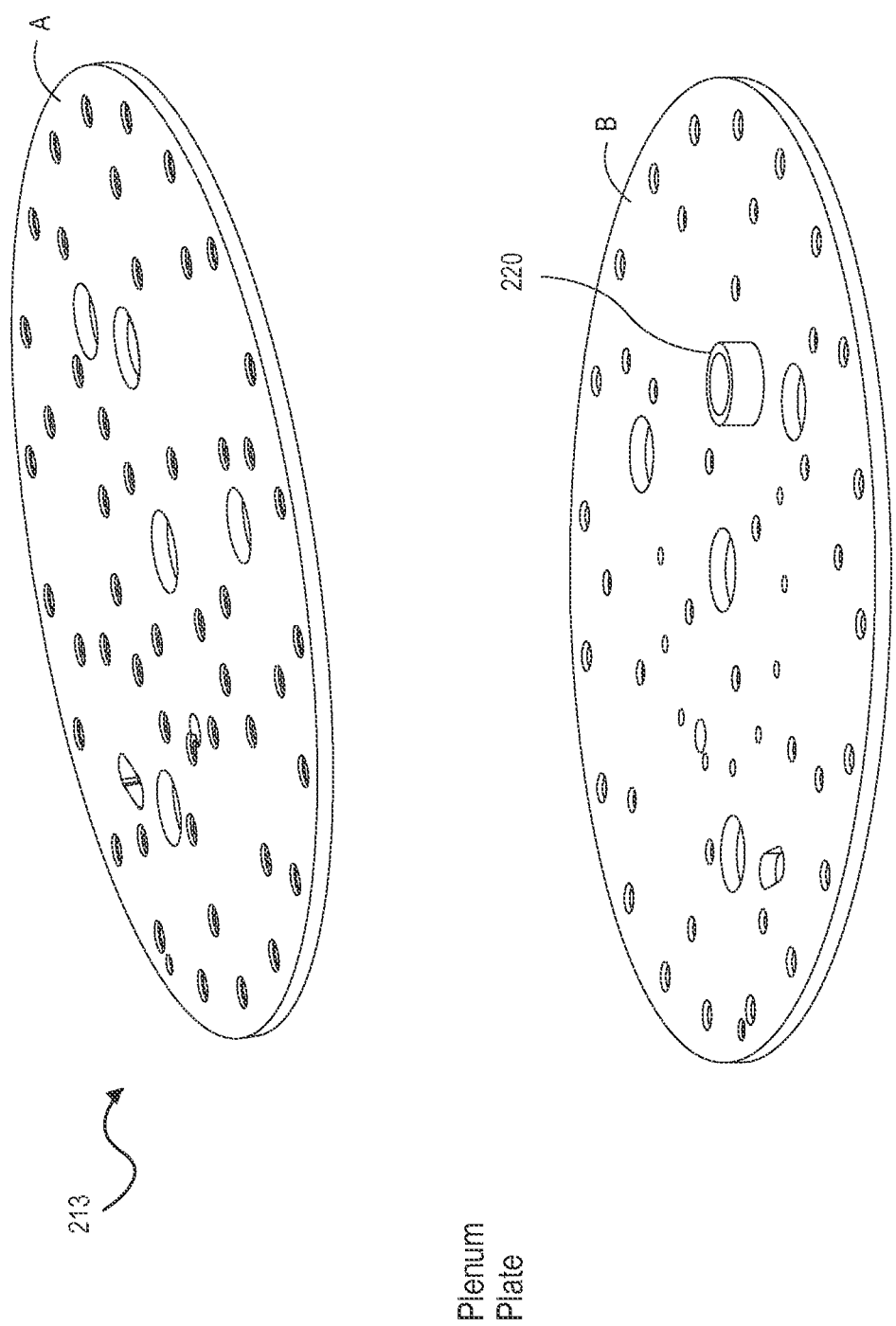
FIG. 2e illustrates an isometric view of top and bottom sides of a plenum plate that is employed in the cooling base assembly of FIG. 2a, in accordance with an embodiment.
Figure 2F:
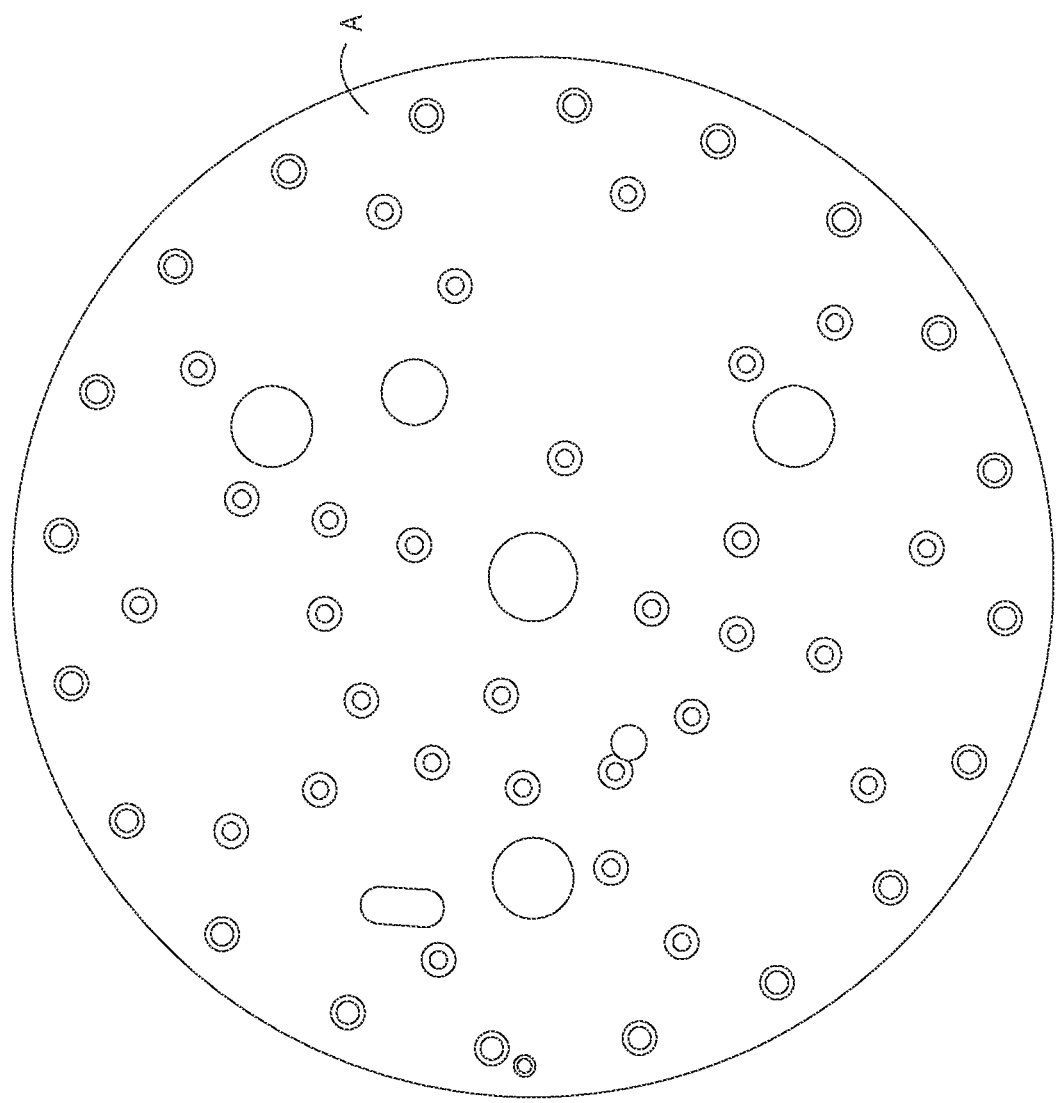
FIG. 2f illustrates a plan view of a top surface of the plenum plate of FIG. 2e, in accordance with an embodiment.
Figure 2G:
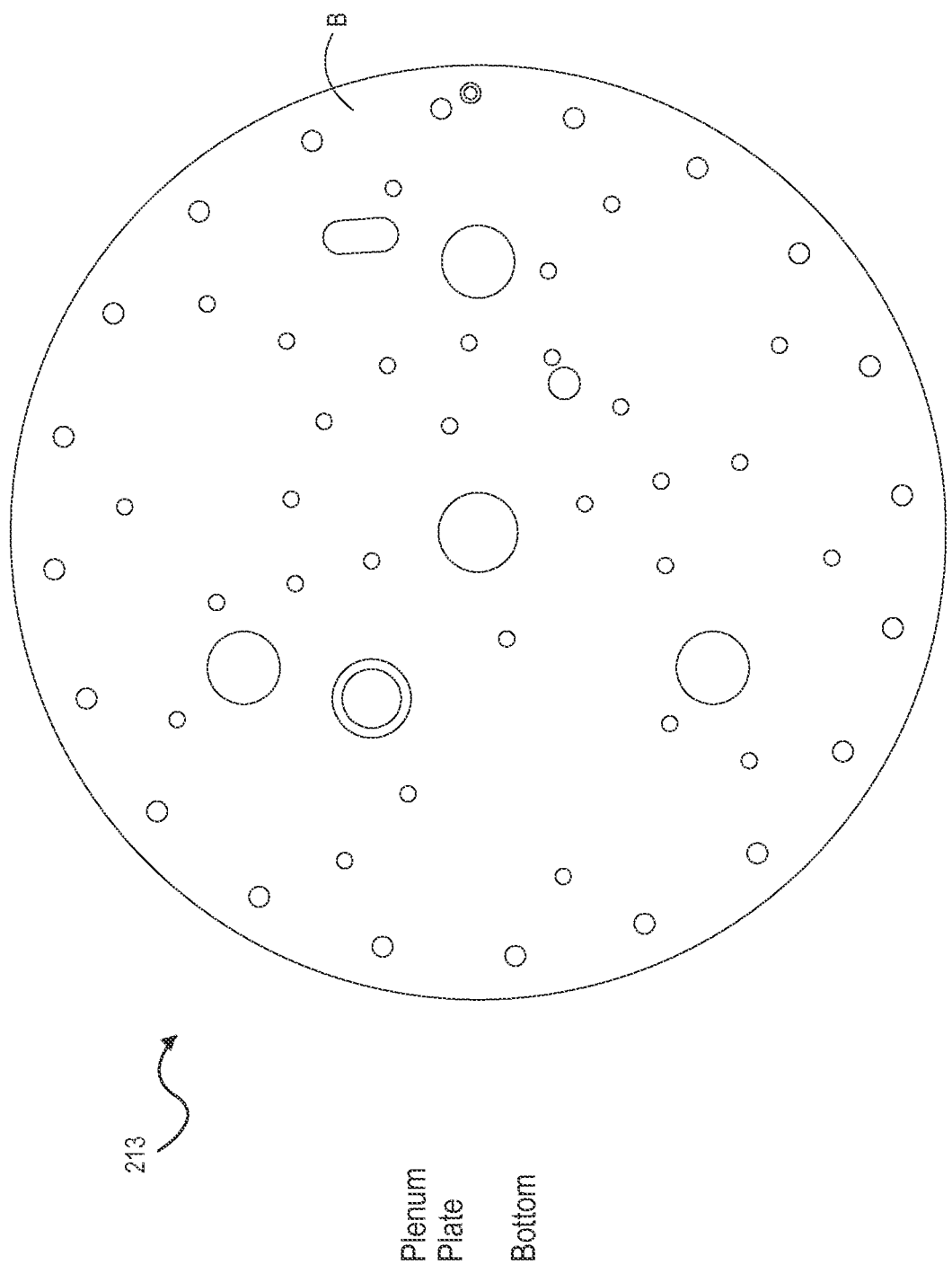
FIG. 2g illustrates a plan view of a bottom surface of the plenum plate of FIG. 2e, in accordance with an embodiment.
Figure 2H:
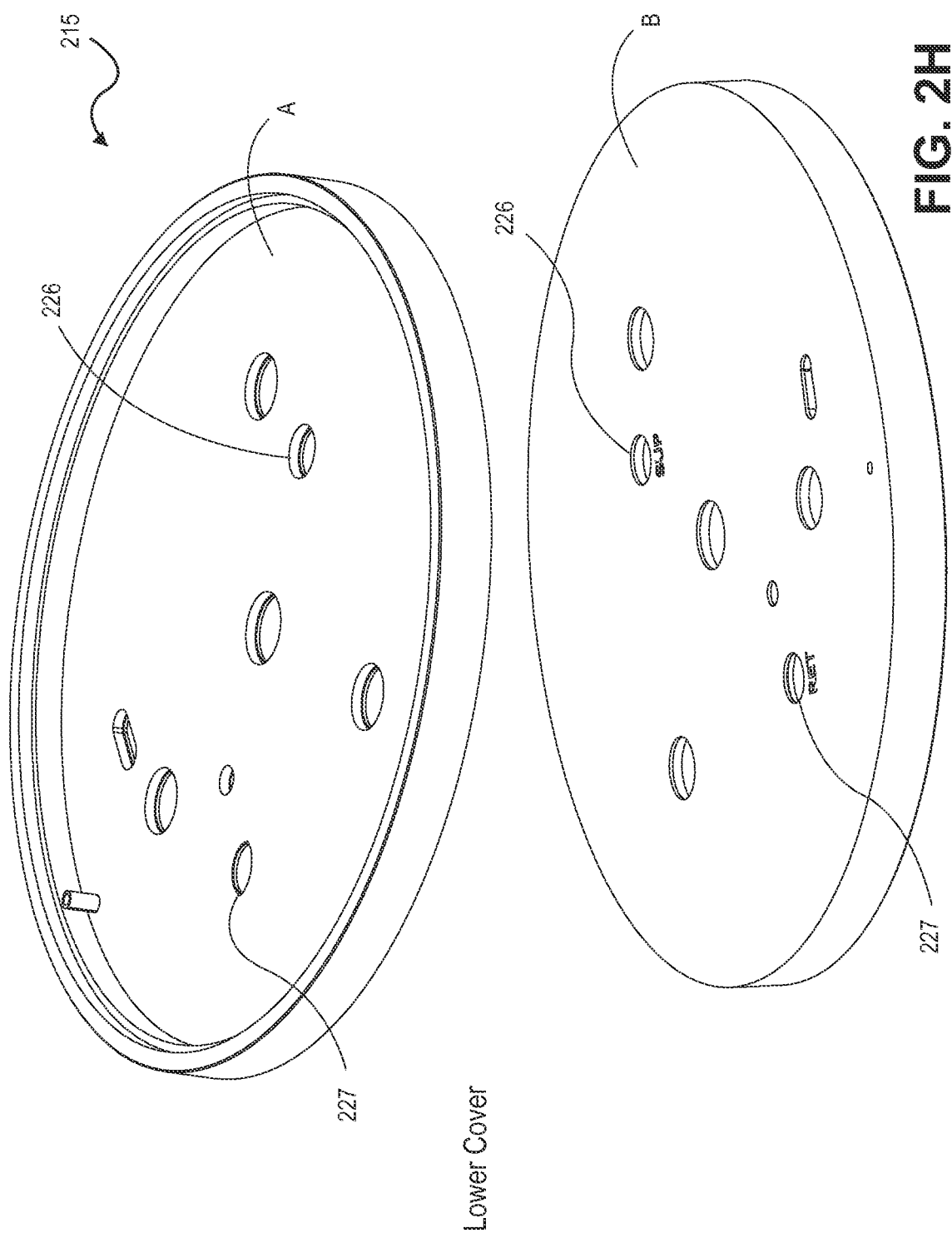
FIG. 2h illustrates an isometric view of top and bottom sides of a lower cover employed in the cooling base assembly of FIG. 2a, in accordance with an embodiment.
Figure 21:
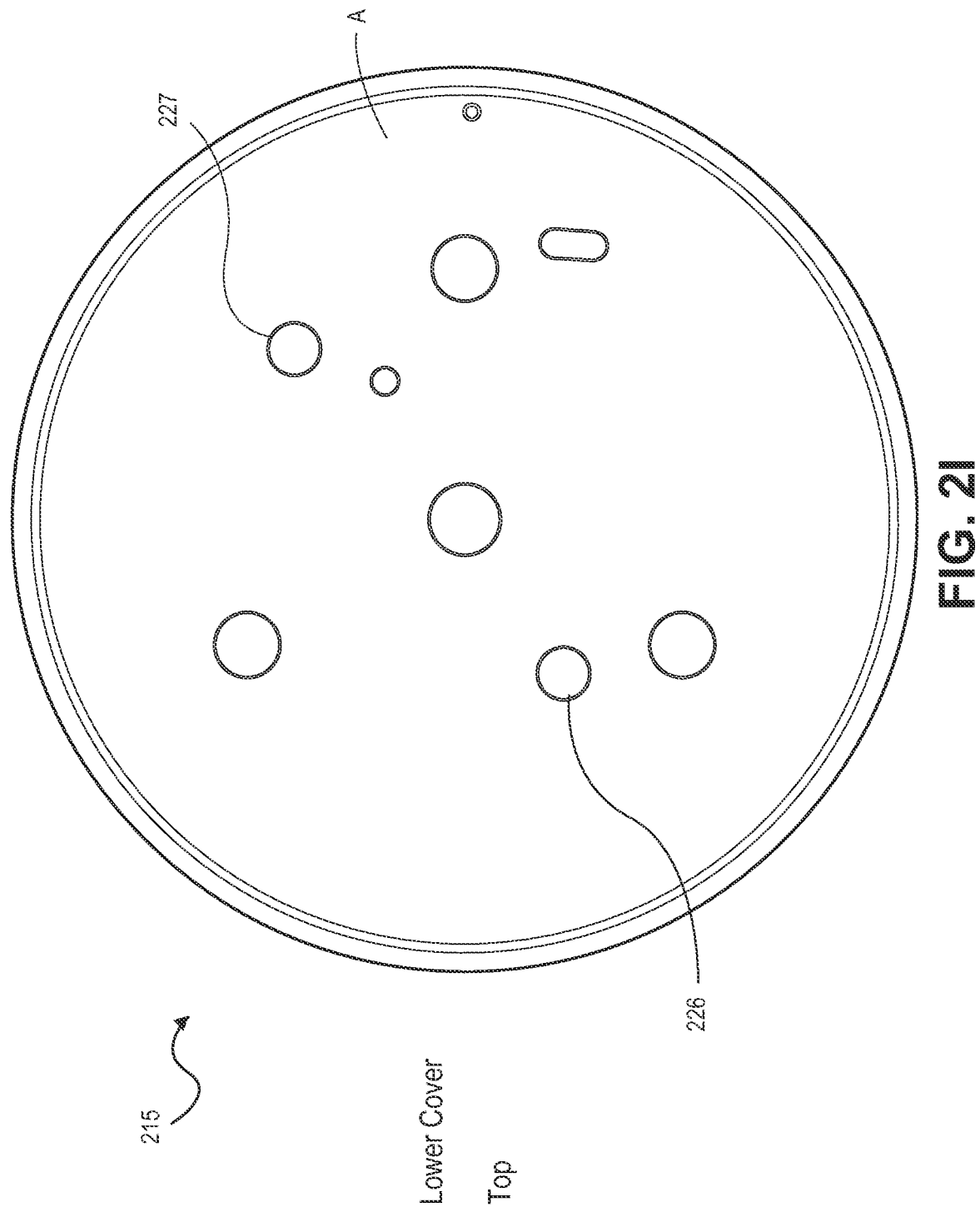
Figure 2J:
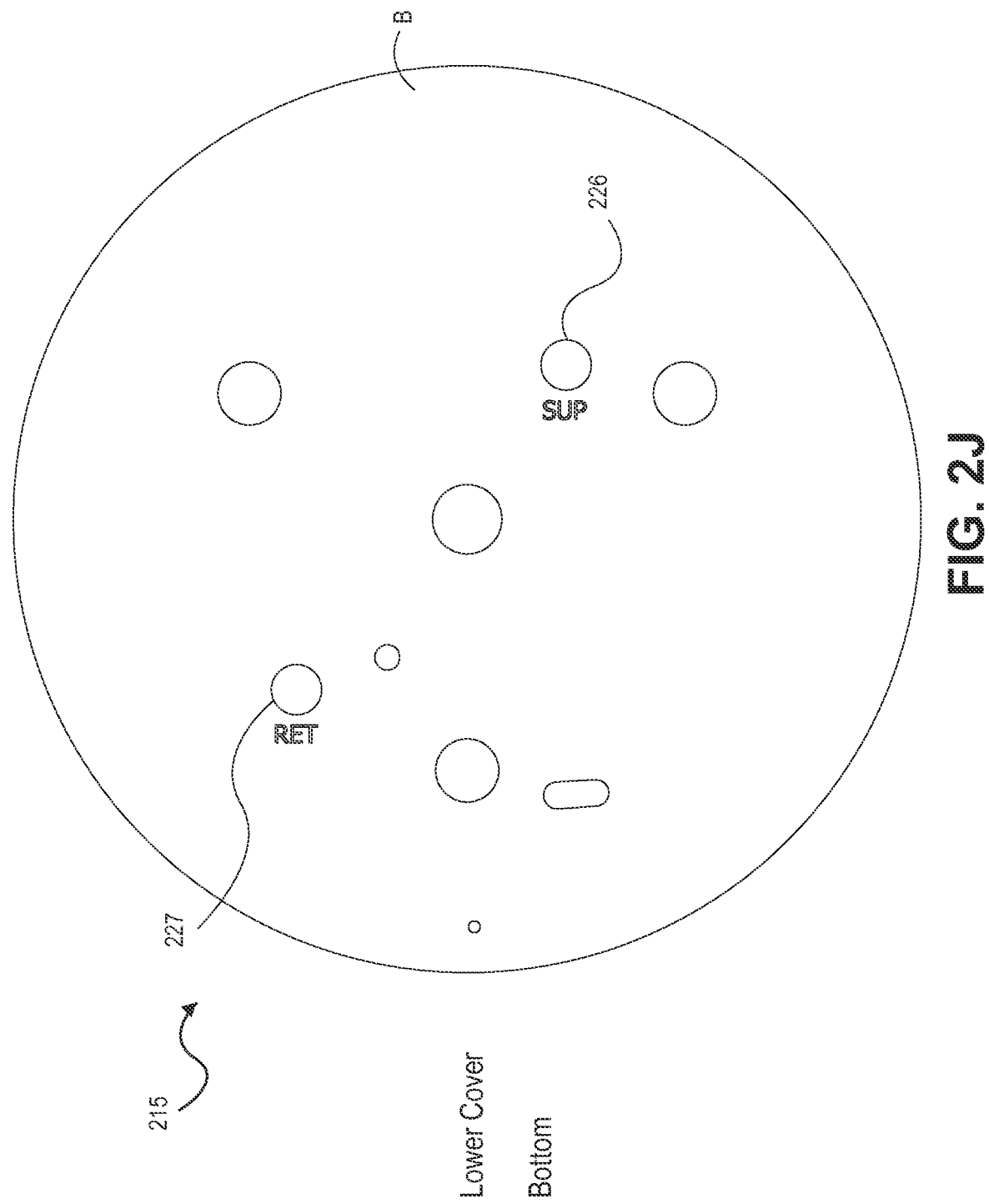
FIG. 2j illustrates a plan view of a bottom surface of the lower cover of FIG. 2h, in accordance with an embodiment.

FIGS. 2b-2j illustrate isometric and plan views of components of the cooling base assembly of FIG. 2a, in accordance with embodiments of the invention. FIGS. 2b-2d illustrate an embodiment of a distribution plate 212 with a plurality of nozzles 211 and a plurality of return conduits 214. FIG. 2b illustrates an inner diameter 223 of one of the plurality of nozzles 211 and an inner diameter 224 of one of the return conduits. FIGS. 2e-2g illustrate an embodiment of a plenum plate 213 with an inlet 220 to bypass fluid through the plenum plate 213 to a supply plenum. FIGS. 2h-2j illustrate an embodiment of a lower cover 215 with a supply opening 226 and a return opening 227.

Figure 3A:
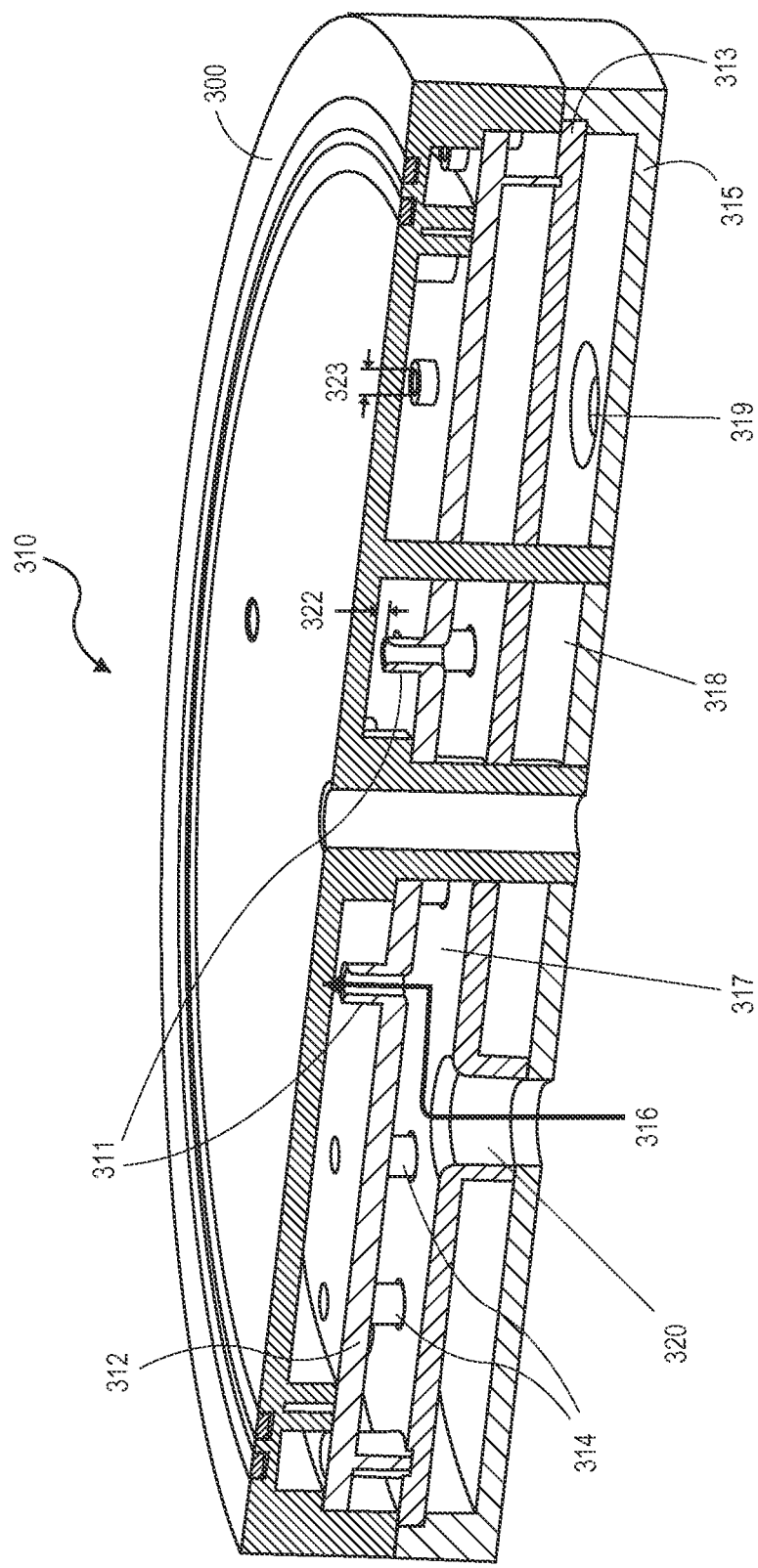
FIG. 3a illustrates a cross-sectional isometric view of a cooling base assembly that is employed in the pedestal assembly of FIG. 1, and illustrates a supply flow path in the cooling base assembly, in accordance with an embodiment.

FIG. 3a illustrates a cross-sectional isometric view of a cooling base assembly that is employed in the pedestal assembly of FIG. 1, and illustrates a supply flow path in the cooling base assembly, in accordance with an embodiment. The cooling base assembly 310 includes a base 300 and a lower cover 315, which form an upper and lower cap. In between the base 300 and the lower cover 315 are a supply plenum 317 and a return plenum 318. A distribution plate 312 is disposed over the supply plenum 317, and the supply plenum 317 is disposed over and separated from the return plenum 318 by a plenum plate 313. An inlet 320 passes fluid through the return plenum 318 and the plenum plate 313 to the supply plenum 317. The supply flow path 316 of heat transfer fluid is an exemplary supply path, and passes through the inlet 320 to the supply plenum 317, and from the supply plenum 317 through the plurality of nozzles 311 to impinge on the surface of the base 300. In the exemplary embodiment of FIG. 3a, a gap 322 exists between a top surface of at least one of the plurality of nozzles 311 and the base 300. In one such embodiment, standoffs couple the base 300 and the distribution plate 312. As illustrated, one of the plurality of nozzles 311 has an inner diameter 323 to project a spray or jet of a desired conductance to achieve a rate of cooling. The supply plenum 317 is at a higher pressure than the return plenum 318 to enable fluid return to the return plenum 318 via return conduits 314 that bypass the supply plenum 317.

Figure 3B:
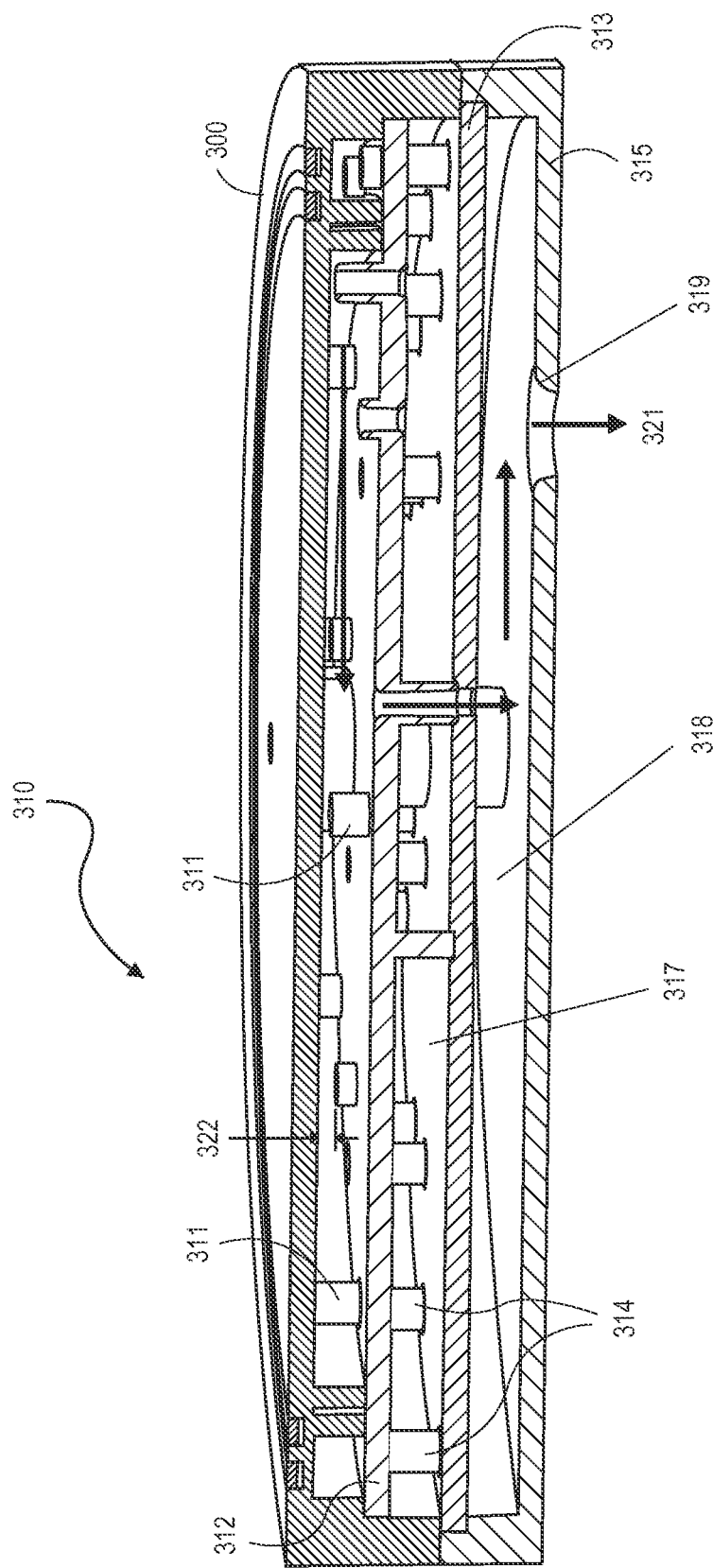
FIG. 3b illustrates a cross-sectional isometric view of a cooling base assembly that is employed in the pedestal assembly of FIG. 1, and illustrates a return flow path in the cooling base assembly, in accordance with an embodiment.

FIG. 3b illustrates a cross-sectional isometric view of a cooling base assembly that is employed in the pedestal assembly of FIG. 1, and illustrates a return flow path in the cooling base assembly, in accordance with an embodiment. The fluid return path 321 is an exemplary return path, and illustrates that fluid supplied by the plurality of nozzles 311 travels within the volume between the distribution plate 312 and the base 300 and to the return plenum 318 via a plurality of return conduits 314, which pass through the supply plenum 317. From the return plenum 318, returned fluid is sent to heat exchanger via the outlet 319. In one embodiment, the fluid is then cooled or heated by the heat exchanger and recirculated back through the inlet 320.

Figure 3C:
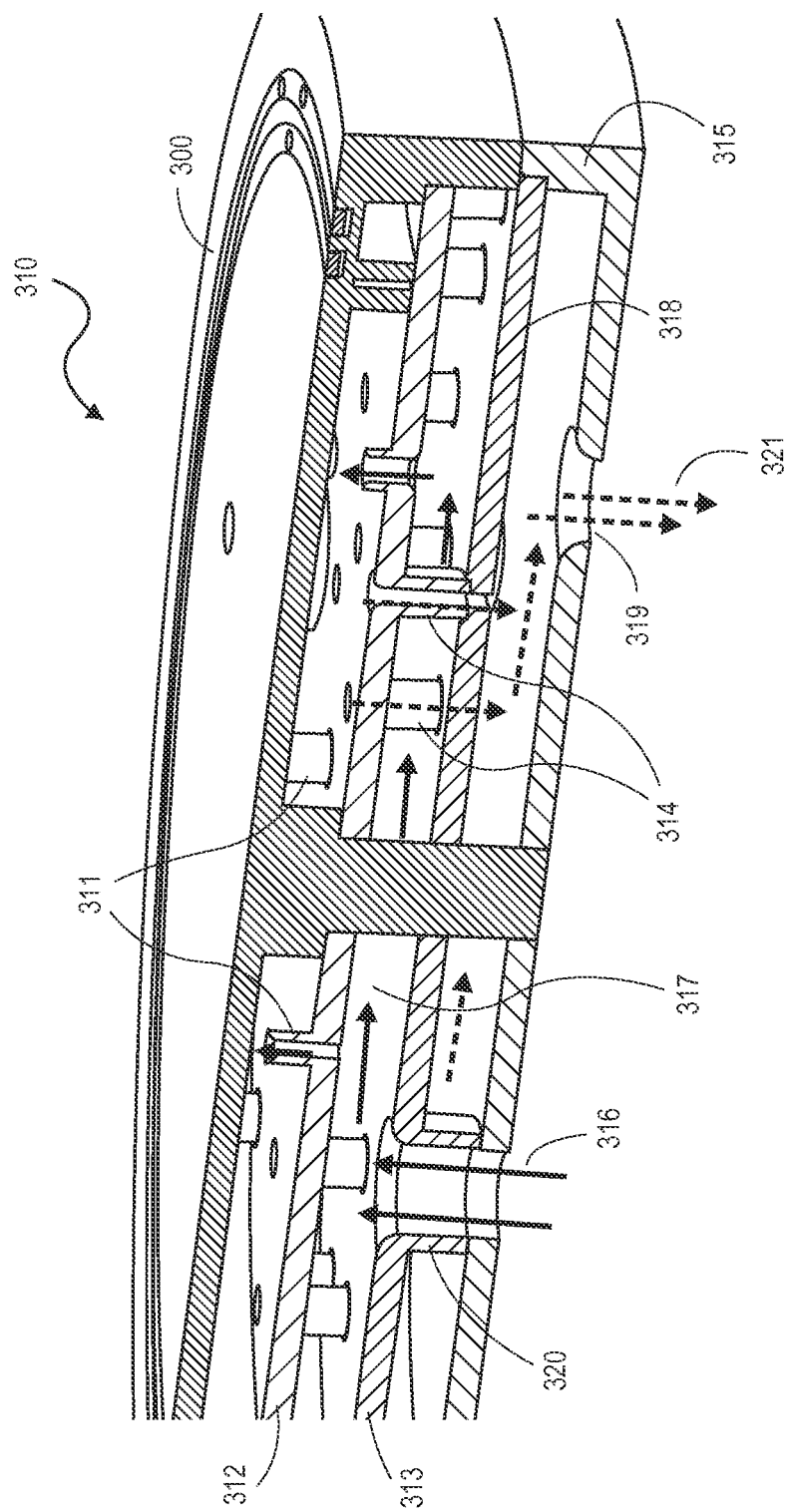
FIG. 3c illustrates a cross-sectional isometric view of a cooling base assembly that is employed in the pedestal assembly of FIG. 1, and illustrates a supply flow path and a return flow path, in accordance with an embodiment.

FIG. 3c illustrates a cross-sectional isometric view of a cooling base assembly 310 that is employed in the pedestal assembly of FIG. 1, and illustrates both an exemplary supply path 316 and an exemplary return flow path 321, in accordance with an embodiment.

Figure 4:
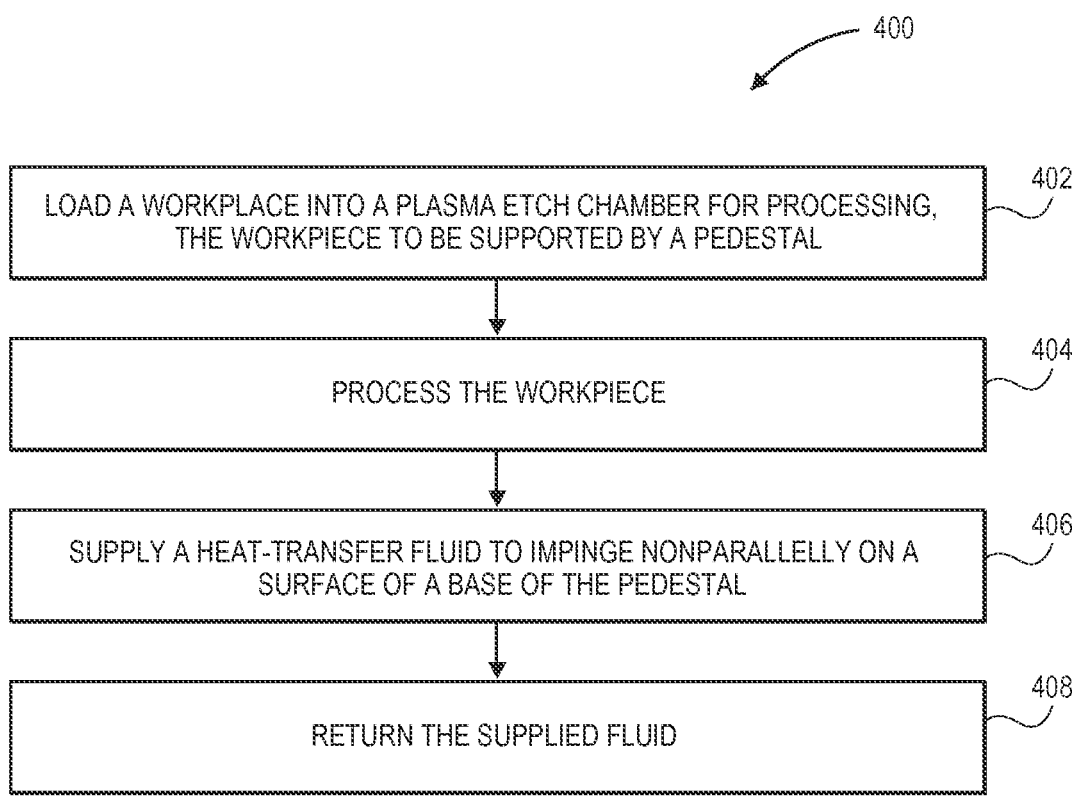
FIG. 4 illustrates a flow diagram of a method of cooling a workpiece via a cooling base assembly such as in FIG. 2a, in accordance with an embodiment.

FIG. 4 illustrates a flow diagram of a method 400 of cooling a workpiece via a cooling base assembly such as in FIG. 2a, in accordance with an embodiment. Although shown in a particular sequence or order, unless otherwise specified, the order of the actions can be modified. Thus, the illustrated implementations should be understood only as examples, and the illustrated method can be performed in a different order, and some actions may be performed concurrently. Additionally, one or more actions can be omitted in various embodiments of the invention; thus, not all actions are required in every implementation.

According to the method 400, a workpiece is loaded into a plasma etch chamber for processing, 402. The workpiece is to be supported by a pedestal according to any embodiment described herein (e.g., a pedestal including the base cooling assembly 210 of FIG. 2a). After loading the workpiece, processing of the workpiece is commenced, 404. During processing of the workpiece, a heat transfer fluid is supplied to impinge nonparallelly on a surface of a base of the pedestal (e.g., fluid is projected by nozzles such as the plurality of nozzles 211 in FIG. 2a). After supplying the fluid, the fluid is returned via a plurality of return conduits to a return plenum (e.g., via the plurality of return conduits 214 to the plenum 218 of FIG. 2a), 406.

It is to be understood that the above description is intended to be illustrative, and not restrictive. Many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A pedestal to support a workpiece during plasma processing, the pedestal comprising:
    a base over which the workpiece is to be disposed;
    a plurality of nozzles to supply a fluid from a supply plenum to impinge nonparallelly on a surface of the base, the plurality of nozzles included in a distribution plate, the distribution plate having a first surface opposite a second surface, and the plurality of nozzles having portions protruding from the first surface of the distribution plate, wherein the protrusions each have an opening extending entirely through the distribution plate from the first surface of the distribution plate to the second surface of the distribution plate; and
    a plurality of return conduits to return the supplied fluid to a return plenum, the plurality of return conduits protruding from the second surface of the distribution plate, wherein the return conduits each have an opening extending entirely through the distribution plate from the first surface of the distribution plate to the second surface of the distribution plate.

2. The pedestal of claim 1, wherein the plurality of nozzles is configured to project the fluid as one or more jets submerged in surrounding fluid within a volume between the plurality of nozzles and the base to impinge nonparallelly on the surface of the base.

3. The pedestal of claim 1, wherein the plurality of nozzles is to project the fluid as a spray to emerge from a surrounding fluid within a volume between the plurality of nozzles and the base to impinge nonparallelly on the surface of the base.

4. The pedestal of claim 1, wherein a top surface of each of the plurality of nozzles is spaced a distance away from the surface of the base.

5. The pedestal of claim 1, wherein the fluid is a liquid.

6. The pedestal of claim 1, wherein:
the base is disposed over the distribution plate;
the distribution plate is disposed over the supply plenum; and
the supply plenum is disposed over and separated from the return plenum by a plenum plate.

7. The pedestal of claim 6, further comprising an inlet conduit extending through the return plenum to supply the fluid to the supply plenum.

8. The pedestal of claim 7, wherein the inlet conduit is a part of the distribution plate.

9. The pedestal of claim 1, wherein a total conductance of the plurality of return conduits is greater than a total conductance of the plurality of nozzles.

10. The pedestal of claim 9, wherein an inner diameter of at least one of the plurality of return conduits is greater than an inner diameter of at least one of the plurality of nozzles.

11. A plasma etch system comprising:
a vacuum chamber;
a showerhead through which a source gas is supplied to the vacuum chamber;
the pedestal of claim 1; and
an RF generator coupled to at least one of the vacuum chamber, showerhead or pedestal.

12. The plasma etch system of claim 11, wherein the plurality of nozzles is to project the fluid as one or more jets submerged in surrounding fluid within a volume between the plurality of nozzles and the base to impinge nonparallelly on the surface of the base.

13. The plasma etch system of claim 11, wherein the plurality of nozzles is to project the fluid as a spray to emerge from a surrounding fluid within a volume between the plurality of nozzles and the base to impinge nonparallelly on the surface of the base.

14. The plasma etch system of claim 11, wherein a top surface of each of the plurality of nozzles is spaced a distance away from the surface of the base.

15. The plasma etch system of claim 11, wherein the fluid is a liquid.

16. The plasma etch system of claim 11, wherein:
the base is disposed over a distribution plate comprising the plurality of nozzles and the plurality of return conduits;
the distribution plate is disposed over the supply plenum;
the supply plenum is disposed over and separated from the return plenum by a plenum plate;
an inlet conduit through the return plenum supplies the fluid to the supply plenum; and
a heat transfer fluid loop fluidly couples the supply plenum to a high pressure side of a heat exchanger via an inlet conduit through the return plenum, and fluidly couples the return plenum to a low pressure side of the heat exchanger via the plurality of return conduits.

17. The plasma etch system of claim 11, wherein a total conductance of the plurality of return conduits is greater than a total conductance of the plurality of nozzles.

18. The plasma etch system of claim 11, wherein an inner diameter of at least one of the plurality of return conduits is greater than an inner diameter of at least one of the plurality of nozzles.

* * * * *